United States Patent
Polley et al.

(10) Patent No.: US 10,082,527 B2
(45) Date of Patent: Sep. 25, 2018

(54) REMOVAL OF HIGHER ORDER MAGNETIC INTERFERENCE IN MAGNETIC FIELD BASED CURRENT SENSORS

(71) Applicant: Texas Instruments Incorporated, Dallas, TX (US)

(72) Inventors: Arup Polley, Richardson, TX (US); Russell Melvin Rosenquist, Plano, TX (US); Terry Lee Sculley, Lewisville, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 196 days.

(21) Appl. No.: 14/941,319

(22) Filed: Nov. 13, 2015

(65) Prior Publication Data

US 2016/0356819 A1    Dec. 8, 2016

Related U.S. Application Data

(60) Provisional application No. 62/170,605, filed on Jun. 3, 2015.

(51) Int. Cl.
*G01R 15/20* (2006.01)
*G01R 19/00* (2006.01)

(52) U.S. Cl.
CPC ......... *G01R 15/20* (2013.01); *G01R 19/0053* (2013.01); *G01R 19/0092* (2013.01)

(58) Field of Classification Search
CPC .... G01R 15/18; G01R 15/183; G01R 15/185; G01R 15/20; G01R 15/205
See application file for complete search history.

(56) References Cited

U.S. PATENT DOCUMENTS 4,492,919 A * 1/1985 Milkovic ............. G01R 15/146
                                                    323/357
4,596,950 A * 6/1986 Lienhard ............. G01R 15/205
                                                    324/117 R (Continued)

*Primary Examiner* — Walter L Lindsay, Jr.
*Assistant Examiner* — Milton Gonzalez
(74) *Attorney, Agent, or Firm* — Kenneth Liu; Charles A. Brill; Frank D. Cimino (57) ABSTRACT

A system for measuring current includes a conductive trace comprising N substantially parallel straight sections having a substantially constant cross-section, N≥4. Adjacent substantially straight sections are spaced apart by a given distance and each pair of adjacent straight sections is connected by a respective loop of the current trace such that current in odd-numbered straight sections flows in a first direction and current in even-numbered straight sections flows in an opposite direction. The N magnetic field based current sensors are each positioned on a respective straight section of the conductive trace. The current is calculated based on

$$\frac{\left(S(1) - \binom{N-1}{1}S(2) + \binom{N-1}{2}S(3) - \ldots - \binom{N-1}{N-3}S(N-2) + \binom{N-1}{N-2}S(N-1) - S(N)\right)}{2^{(N-1)}};$$

$$\binom{M}{k} = \frac{M!}{(M-k)!k!};$$

where M=N−1, and S(i) is the measured signal read at magnetic field based current sensor i.

14 Claims, 8 Drawing Sheets

(56) References Cited

U.S. PATENT DOCUMENTS

| | | | | |
|---|---|---|---|---|
| 7,847,542 | B2 * | 12/2010 | Bartos | G01D 5/145 |
| | | | | 324/207.21 |
| 7,902,811 | B2 * | 3/2011 | Shoji | G01R 15/205 |
| | | | | 324/117 R |
| 2004/0201374 | A1 * | 10/2004 | Kawase | G01R 15/185 |
| | | | | 324/117 R |
| 2010/0052664 | A1 * | 3/2010 | Nishizawa | G01D 5/2451 |
| | | | | 324/207.25 |
| 2010/0156394 | A1 | 6/2010 | Ausserlechner et al. | |
| 2013/0138372 | A1 * | 5/2013 | Ausserlechner | G01R 35/005 |
| | | | | 702/65 |
| 2015/0198679 | A1 | 7/2015 | Ausserlechner | |
| 2015/0355241 | A1 * | 12/2015 | Kawanami | G01R 15/20 |
| | | | | 324/117 R |

* cited by examiner

REMOVAL OF HIGHER ORDER MAGNETIC INTERFERENCE IN MAGNETIC FIELD BASED CURRENT SENSORS

CLAIM OF PRIORITY AND RELATED PATENT APPLICATIONS

This nonprovisional application claims priority based upon the following prior United States provisional patent application(s): (i) "REMOVAL OF HIGHER ORDER MAGNETIC INTERFERENCE IN MAGNETIC FIELD BASED CURRENT SENSORS," Application No. 62/170,605, filed Jun. 3, 2015, in the name(s) of Arup Polley, Russ Rosenquist and Terry Sculley, which is hereby incorporated by reference in its entirety.

FIELD OF THE DISCLOSURE

Disclosed embodiments relate generally to the field of current sensing. More particularly, and not by way of any limitation, the present disclosure is directed to removing higher-order magnetic interference in magnetic field based current sensors.

BACKGROUND

In magnetic field based non-contact current sensors, current through a low-resistance metal trace creates a magnetic field that is sensed by a magnetic sensor. Intensity of the created magnetic field is proportional to the current flowing through the trace. A differential sensor placement is typically used to cancel any uniform external background magnetic field as common-mode signal. However, a gradient in the external magnetic field can still create significant differential signal interference, which limits the accuracy in measurement. A gradient in the magnetic field can be produced by the proximity of a magnet, other current carrying trace, or even magnetic metal to the current sensor, which changes Earth's relatively uniform magnetic field in the local vicinity.

Figure 5:
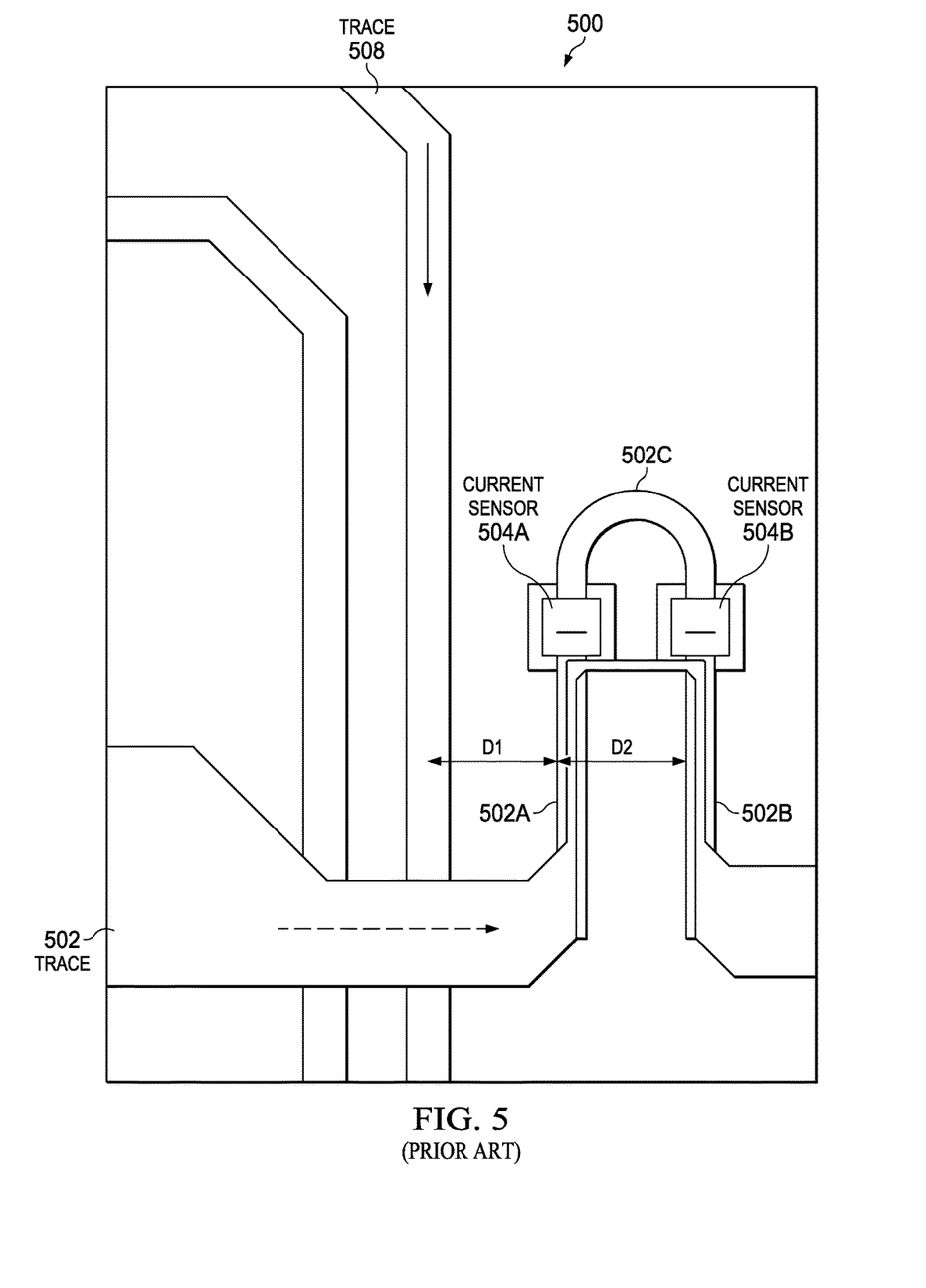
FIG. 5 depicts an example of a system for current sensing as known in the art.

An example of a current carrying trace causing interference is shown in FIG. 5, which shows system 500 containing two magnetic field based current sensors 504A and 504B. In system 500, the current in trace 502 is to be measured. As trace 502 nears the sensor location, trace 502 is narrowed to concentrate the magnetic field produced by the current and the current is directed into a current loop that includes two parallel sections 502A and 502B and curved section 502C, such that the current in sections 502A and 502B is flowing in opposite directions. Magnetic field based current sensor 504A measures the current in trace section 502A and magnetic field based current sensor 504B measures the current in trace section 502B.

Trace 508 carries a current that can interfere with the measurements of trace 502. The distance D1 between trace 508 and trace section 502A is 7.5 mm while the distance D2 between trace sections 502A and 502B is 6.4 mm. Trace 508 is also offset from trace 502 by 1.48 mm in the Z-axis. Table 1 below shows the difference in interference between magnetic field based current sensors 504A and 504B.

TABLE 1

| Parameters | Measured Data |
| --- | --- |
| Current Sensitivity (Differential) | 168 mV/A |
| Current resolution (Bandwidth Normalized) | 10 µA/√Hz |

TABLE 1-continued

| Parameters | Measured Data |
| --- | --- |
| Current resolution (Bandwidth: 10 kHz) | 1 mA |
| Interference on Left sensor | 12 mV/A |
| Interference on Right sensor | 6 mV/A |
| Differential interference | 6 mV/A |
| Equivalent current interference | 35.7 mA/A |

Prior solutions to the problem of interference have included:
A. Reducing the distance between the sensors;
B. Carefully routing other current trace(s); and
C. Magnetic shielding using high permeability material.

However, the minimum distance between sensors in solution A is limited by the design, while remnant interference can still be significant. The routing solutions are only applicable for interference from current traces and do not address external sources such as a magnet. Solution B also limits the routing options, while solution C is inherently expensive.

SUMMARY

The solution is to use more than two sensors to obtain information about higher order components of the magnetic field and design the current trace around the sensors such that an appropriate combination of sensor signals results in constructive addition of current-related signals but cancels the higher order external interference. This solution allows the use of current sensors in magnetically harsh environment with higher immunity at relatively lower system complexity and cost.

In one aspect, an embodiment of a system for measuring current is shown. The system includes a conductive trace comprising N substantially parallel straight sections having a substantially constant cross-section, N≥4, wherein adjacent substantially straight sections are spaced apart by a given distance and each pair of adjacent substantially straight sections is connected by a respective loop of the current trace such that current in the odd numbered substantially straight sections flow in a first direction and current in the even numbered substantially straight sections flow in an opposite direction; and N magnetic field based current sensors, each current sensor being positioned on a respective substantially straight section of the conductive trace.

In another aspect, an embodiment of a method of measuring current is disclosed. The method includes providing a conductive trace that comprises N substantially parallel straight sections having a substantially constant cross-section, wherein adjacent substantially straight sections are spaced apart by a given distance and each pair of adjacent straight sections is connected by a respective loop of the current trace such that current in the odd-numbered straight sections flow in a first direction and current in the even-numbered straight sections flows in an opposite direction; positioning N magnetic field based current sensors on a respective straight section of the conductive trace; and determining the current in the conductive trace as $$\frac{\left(S(1) - \binom{N-1}{1}S(2) + \binom{N-1}{2}S(3) - \ldots - \binom{N-1}{N-3}S(N-2) + \binom{N-1}{N-2}S(N-1) - S(N)\right)}{2^{(N-1)}},$$

where S(i) is the measured signal read at magnetic field based current sensor i and $$\binom{M}{k} = \frac{M!}{(M-k)!k!},$$

where M=N−1.

Advantages of the disclosed systems and methods include at least the following:
- Interference-cancelling current sensors can be used in magnetically harsh environment without the need of expensive shielding or constraining current trace design;
- Monolithic integration of multiple sensors is cost-effective in comparison with other techniques of current sensor design with similar performance;
- Uses robust design methods that only depend on placement accuracy of the sensors;
- Sufficient placement accuracy can be achieved even in board implementation; and
- Placement accuracy is sufficient with either integrated sensors or in-package implementations.

BRIEF DESCRIPTION OF THE DRAWINGS

Embodiments of the present disclosure are illustrated by way of example, and not by way of limitation, in the Figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing Figures in which:

DETAILED DESCRIPTION OF THE DRAWINGS

Specific embodiments of the invention will now be described in detail with reference to the accompanying Figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1:
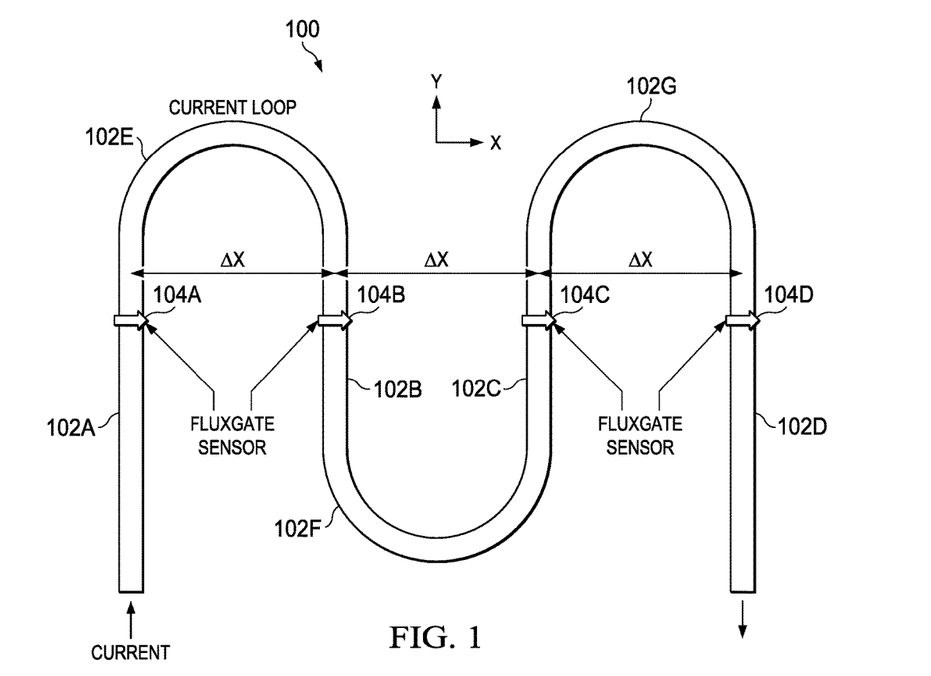
FIG. 1 depicts an example of a system for sensing current using magnetic field based non-contact current sensors according to an embodiment of the disclosure.

Referring now to the drawings and more particularly to FIG. 1, current-measuring system 100 is disclosed according to an embodiment of the disclosure. In this embodiment, current trace 102 is a conductive material having a substantially constant cross-sectional profile, which may be round, square or rectangular. The conductive material can be aluminum, copper, or any other conductive material currently known or unknown. In this figure, trace 102 has already been narrowed to concentrate the magnetic field. Trace 102 includes four substantially parallel sections 102A, 102B, 102C, 102D. Adjacent parallel sections are joined by loop sections 102E, 102F, 102G. That is, parallel sections 102A and 102B are joined by loop section 102E; parallel sections 102B and 102C are joined by loop section 102F; and parallel sections 102C and 102D are joined by loop section 102G. Magnetic field based current sensors 104A, 104B, 104C, 104D are placed above a respective parallel section of trace 102 to measure the current therein. For purposes of discussion the XY coordinates are defined as shown in the figure, although in order to calculate the X component of an interference field, the X-axis is defined to run through current sensors 104. Each adjacent pair of parallel sections of trace 102 is separated by a distance EX. It can be noted that magnetic field based current sensors 104A, 104B, 104C, 104D are arranged in a linear fashion in the embodiment shown. In some embodiments, magnetic field based current sensors 104 are not totally linear, e.g., through process variation. In such instances, the results are still an improvement over the previous solutions, although the accuracy may be somewhat affected. In at least one embodiment the magnetic field based current sensors are fluxgate sensors. In an alternate embodiment, magnetic field based current sensors 104 can be magneto-resistive (XMR) sensor elements, such as anisotropic magneto-resistive (AMR), giant magneto-resistive (GMR), tunneling magneto-resistive (TMR) and colossal magneto-resistive (CMR).

As noted previously, the disclosed arrangement of trace 102 and magnetic field based current sensors 104 is designed in such a way that an appropriate combination of sensor signals will cancel magnetic interference of higher orders while not reducing the signal component of the current measurement. The magnetic field S sensed by each of magnetic field based current sensors 104A, 104B, 104C, 104D can be written as:

$$S = B_1 + B_{interference} \quad \text{(Equation 1)}$$

where $B_1$ is the desired magnetic field proportional to current I and $B_{interference}$ is the magnetic field proportional to the interference.

It is known that the x component of a magnetic field expanded in Taylor series around x=0 is as follows:

$$B_x(x) = B_{x,0} + B_{x,1}x + B_{x,2}x^2 + \quad \text{(Equation 2)}$$

Therefore, the interference magnetic field can be written as:

$$B_{x,interference}(x) = B_0 + B_1 x + B_2 x^2 + \quad \text{(Equation 3)}$$

Using the coordinate system as shown in FIG. 1, the field sensed by each of magnetic field based current sensors 104A, 104B, 104C, 104D can be written as:

$$S_A = B_1 + B_0 - 3/2 B_1 \Delta x + 9/4 B_2 \Delta x^2 + \quad \text{(Equation 4)}$$

$$S_B = -B_1 + B_0 - 1/2 B_1 \Delta x + 1/4 B_2 \Delta x^2 + \quad \text{(Equation 5)}$$

$$S_C = B_1 + B_0 + 1/2 B_1 \Delta x + 1/4 B_2 \Delta x^2 + \quad \text{(Equation 6)}$$

$$S_D = -B_1 + B_0 + 3/2 B_1 \Delta x + 9/4 B_2 \Delta x^2 + \quad \text{(Equation 7)}$$

In order to obtain a cancellation of the interfering magnetic field up to second order interference, we use the equation:

$$\frac{3(S_C - S_B) - (S_D - S_A)}{8} = B_I + \text{interference of order} \geq 3 \quad \text{(Equation 8)}$$

i.e., we are left with only the original signal and interference of order three or greater.

The system shown in FIG. 1 can be extended further by increasing the number of parallel and loop sections and sensors to an arbitrarily large value. The sensors can be combined to calculate a value for the magnetic field generated by the current ($B_1$) with rejection of higher order interference terms, such that if N sensors are used, the interference terms up to order N−2 are removed. The calculation is performed by multiplying the sensors by the coefficients of a binomial expansion with alternating terms, summing those values, and dividing the final sum by $2^{(N-1)}$. In the example system shown in FIG. 1, four sensors are used in calculation such that sensors A/B/C/D are multiplied by the binomial expansion coefficients [+1, −3, +3, −1], and then divided by $2^{(4-1)}=8$. That is, the equation above can be rewritten as:

$$B_I + \text{interference of order} \geq 3 = \frac{(S_A - 3S_B + 3S_C - S_D)}{8} \quad \text{(Equation 9)}$$

A system with six sensors are used in a similar calculation such that sensors A/B/C/D/E/F are multiplied by the binomial expansion coefficients [+1, −5, +10, −10, +5, −1], and then divided by $2^{(6-1)}=32$. That is:

$$B_I + \text{interference of order} \geq 5 = \quad \text{(Equation 10)}$$
$$\frac{(S_A - 5S_B + 10S_C - 10S_D + 5S_E - S_F)}{32}$$

Figure 1A:
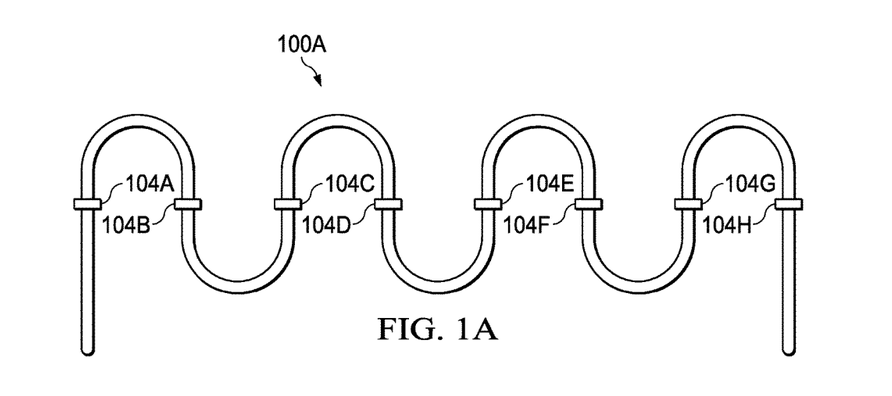
FIG. 1A depicts an example of a system for sensing current using magnetic field based non-contact current sensors according to an embodiment of the disclosure.

FIG. 1A discloses an example system 100A having eight parallel sections and eight sensors 104A, 104B, 104C, 104D, 104E, 104F, 104G, 104H. This system similarly uses the eight sensors in calculation such that they are multiplied by the binomial expansion coefficients [+1, −7, +21, −35, +35, −21, +7, −1] and then divided by $2^{(8-1)}=128$. That is:

$$B_I + \text{interference of order} \geq 7 = \quad \text{(Equation 11)}$$
$$\frac{(S_A - 7S_B + 21S_C - 35S_D + 35S_E - 21S_F + 7S_G - S_H)}{128}$$

This equation can thus be generalized for N sensors, where N is even, as:

$$B_I + \text{interference of order} \geq (N-1) = \quad \text{(Equation 12)}$$
$$\frac{\left(S(1) - \binom{N-1}{1}S(2) + \binom{N-1}{2}S(3) - \ldots - \binom{N-1}{N-3}S(N-2) + \binom{N-1}{N-2}S(N-1) - S(N)\right)}{2^{(N-1)}}$$

where $$\binom{M}{k} = \frac{M!}{(M-k)!k!},$$

where M=N−1.

In the examples disclosed above, N has been an even number. While having an even number of sensors arranged as disclosed provides a pleasing symmetry in the mathematics used to determine the current, the use of an even number of sensors is not necessary. When these embodiments are extended to an odd number of sensors, appropriate changes to the equation used will be derivable by one skilled in the art. Thus the disclosed embodiments are extendable mutatis mutandis to any number of sensors N where N is greater than or equal to four.

Figure 2A:
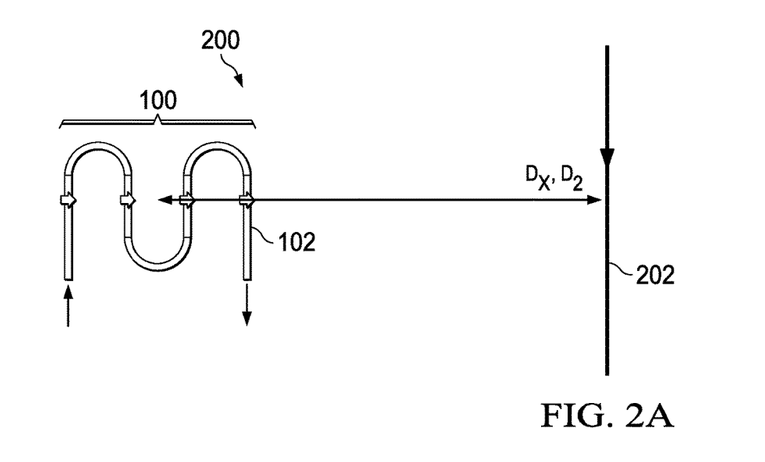
FIG. 2A depicts an example of a system for sensing current that has an interfering current trace according to an embodiment of the disclosure.
Figure 2B:
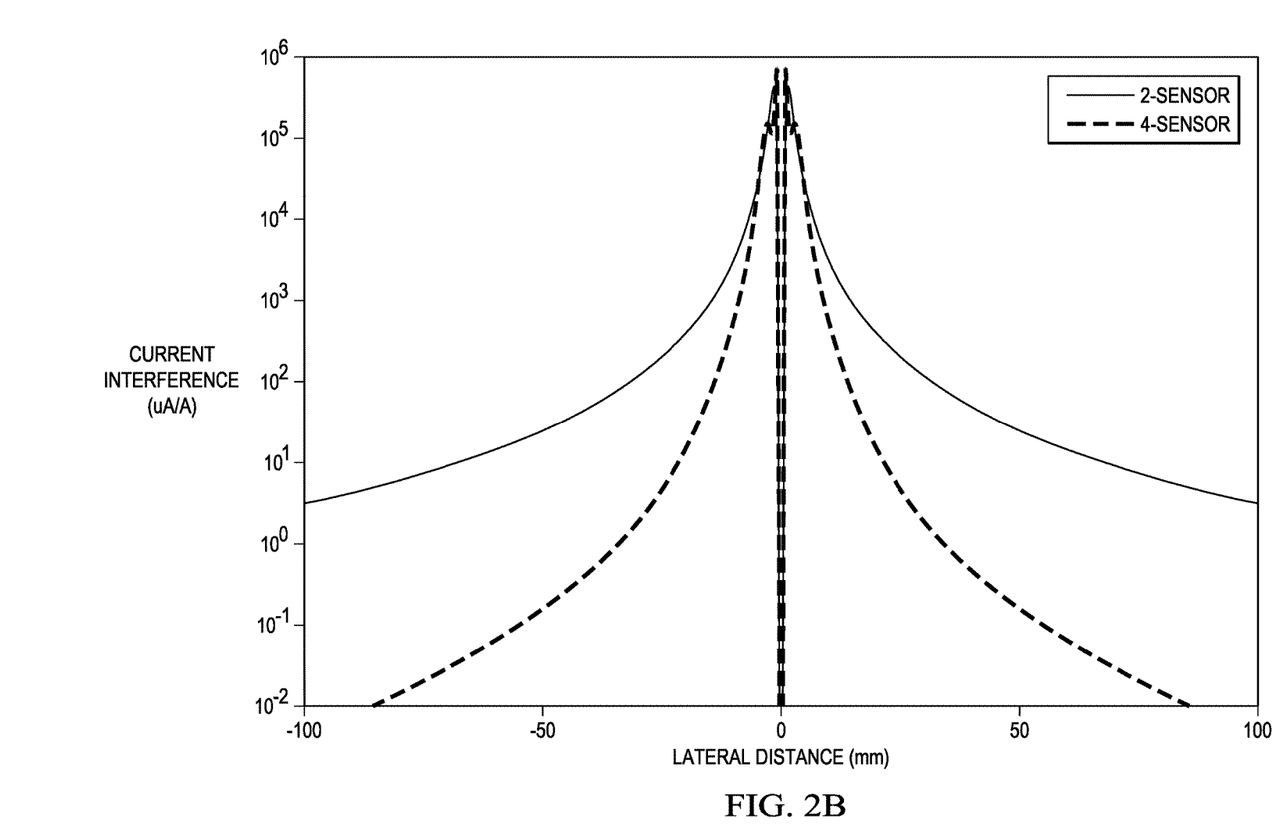
FIG. 2B depicts a graph that illustrates the current interference versus lateral distance of the interfering current trace from the sensor according to the embodiment of FIG. 2A.
Figure 2C:
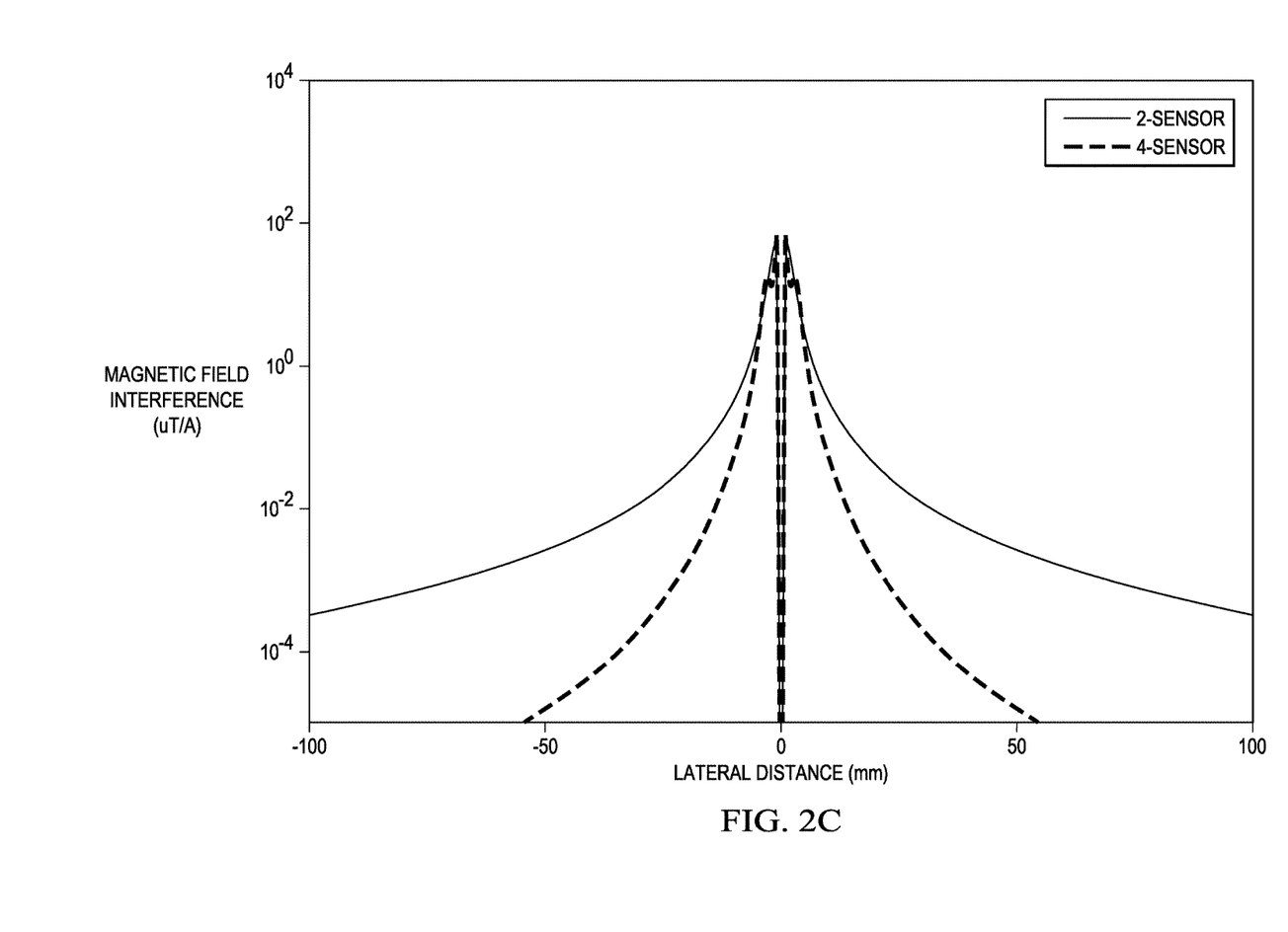
FIG. 2C depicts a graph that illustrates the magnetic field interference versus lateral distance of an interfering magnetic source from the sensor according to the embodiment of FIG. 2A.

FIGS. 2A-2C provide evidence of the improvement in measured interference using the embodiment of FIG. 1. System 200 in FIG. 2A shows current-measuring system 100 and an interfering current trace 202. Interfering trace 202 has a length of 10 mm, an offset in the Z-axis of 1 mm and a current of 1 A. Data is taken as the offset in the X-axis is varied for this layout. FIG. 2B illustrates the measured current interference when two sensors versus four sensors are used to sense the current interference. With both the two-sensor and the four-sensor versions, the interference is zero when the offset in the X-axis is zero, but immediately goes to a high value, here $10^6$ µA/A as the offset moves a small distance off of zero. At a distance x=15 mm, the two-sensor measurement has 1 mA/A of interference, while the four-sensor measurement has only 1 mA/10 A, an order of magnitude difference in the interference. Over the entire range of measurements, the four-sensor measurements of current interference are consistently better and drop at a faster rate. FIG. 2C discloses the same measurements for the magnetic field interference; again the four-sensor design consistently exhibits lower magnetic interference and values drop at a faster rate.

Figure 3A:
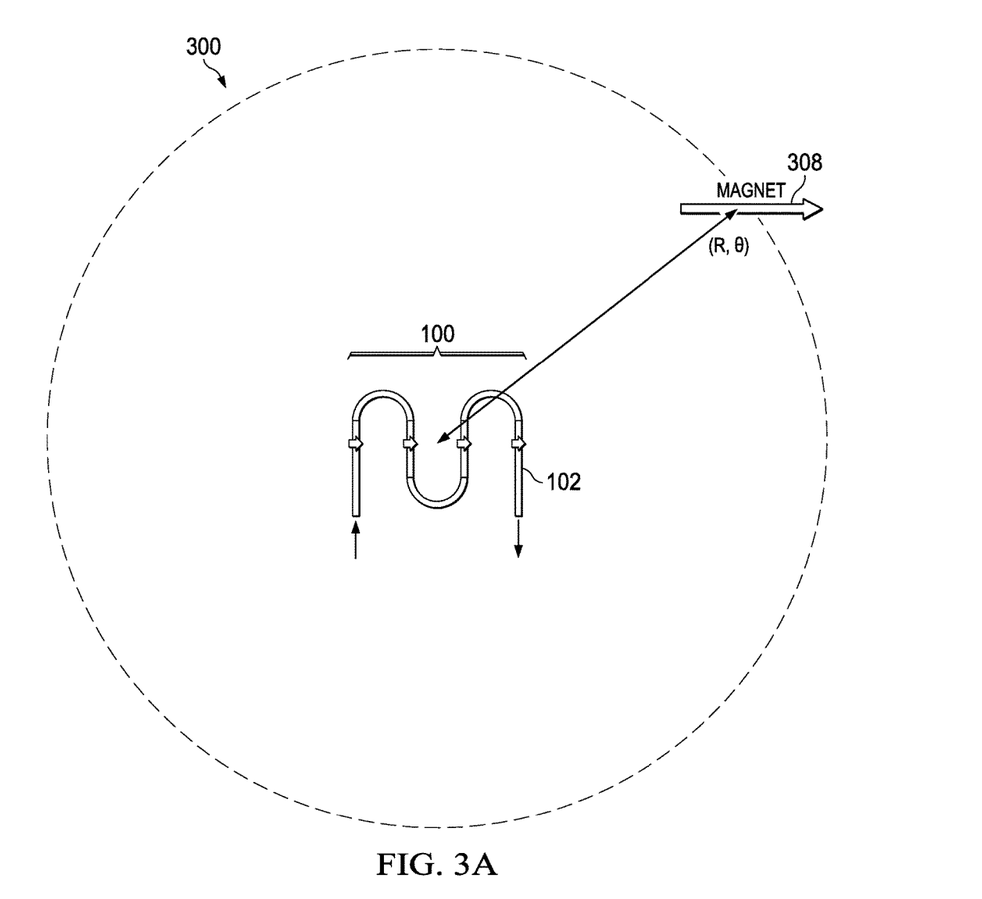
FIG. 3A depicts an example of a system for sensing current and an interfering magnet according to an embodiment of the disclosure.
Figure 3B:
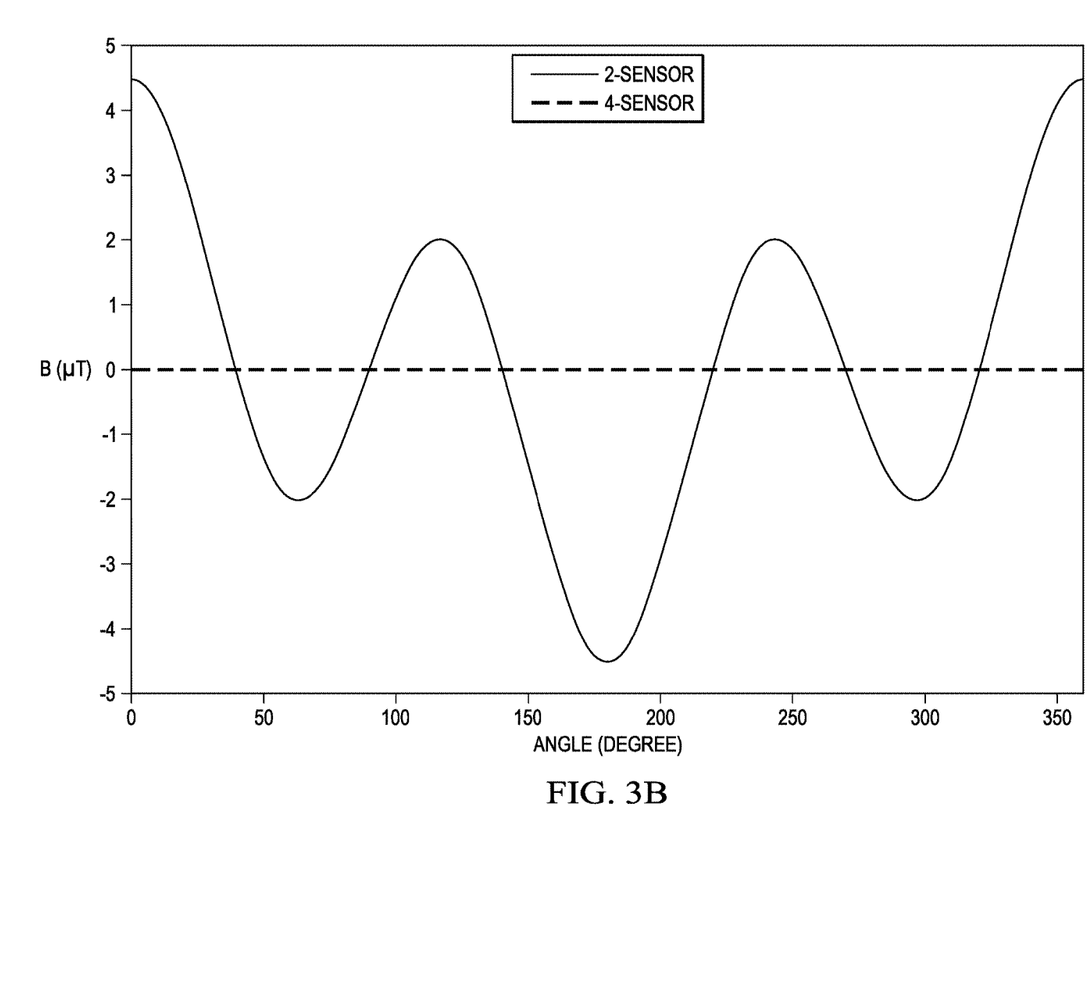
FIG. 3B depicts a graph of the strength of the interference field versus angle of the interfering magnet from the sensor according to the embodiment of FIG. 3A.
Figure 3C:
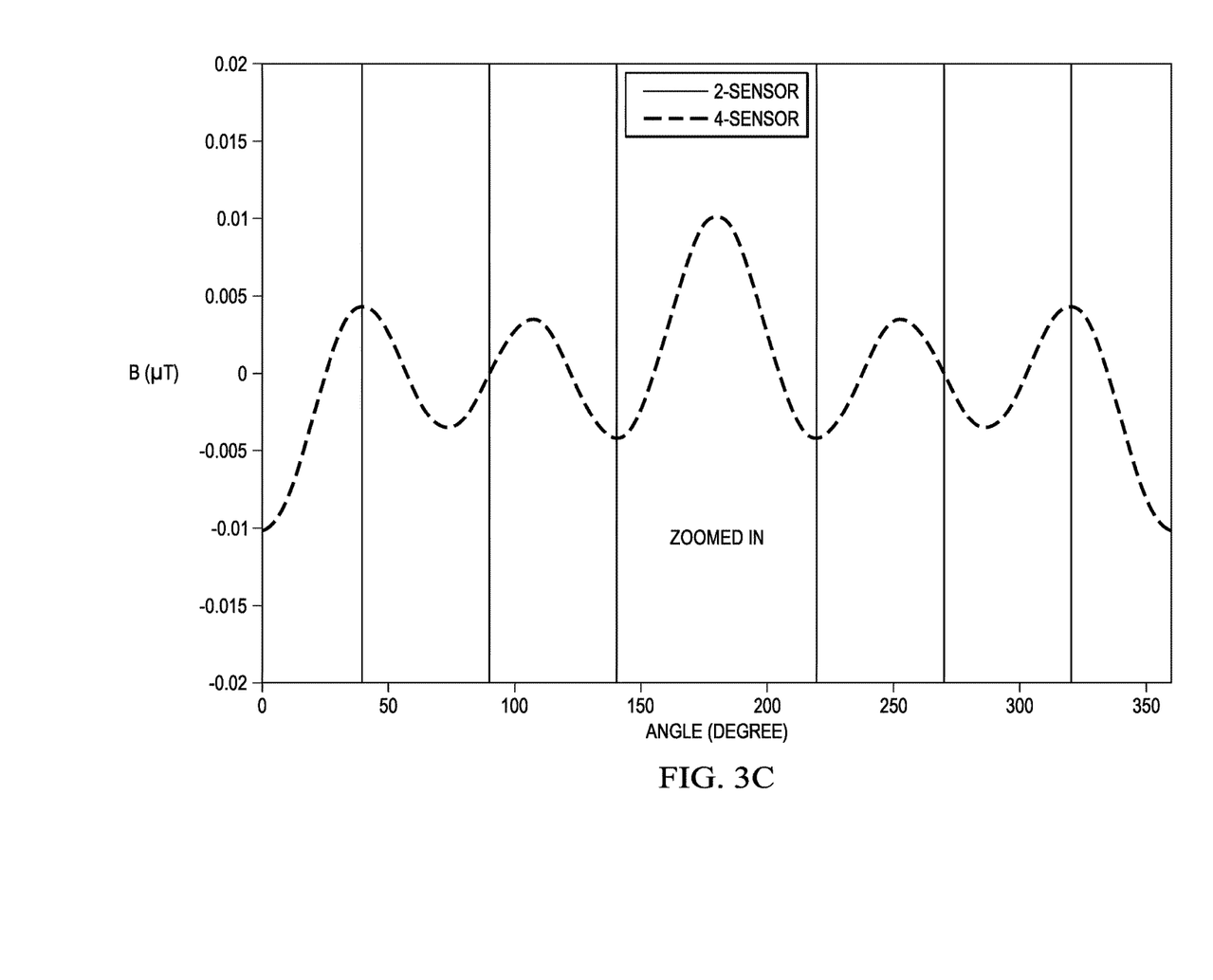
FIG. 3C depicts the graph of FIG. 3B greatly magnified.

FIGS. 3A-3C provide evidence of improvement in measured interference when a magnet is present near the current sensors. System 300 in FIG. 3A shows current-measuring system 100 and an interfering magnet 308. Interfering magnet 308 is located at a distance R from the center of the current-measuring system, with measurements taken as the angle Θ is varied. FIG. 3B illustrates that with a current sensor having two sensors, the interference varies within a range of about nine micro-teslas (i.e., from about 4.5 µT to −4.5 µT), while the interference from the current sensor having four sensors appears to be a constant value of zero. FIG. 3C provides a view of the same data when the scale of the graph is changed to show the variations in the four-sensor embodiment. From this graph, it can be seen that the interference caused by the magnet varies within a range of about 0.02 micro-teslas (i.e. from about −0.01 μT to about 0.01 μT).

Figure 4:
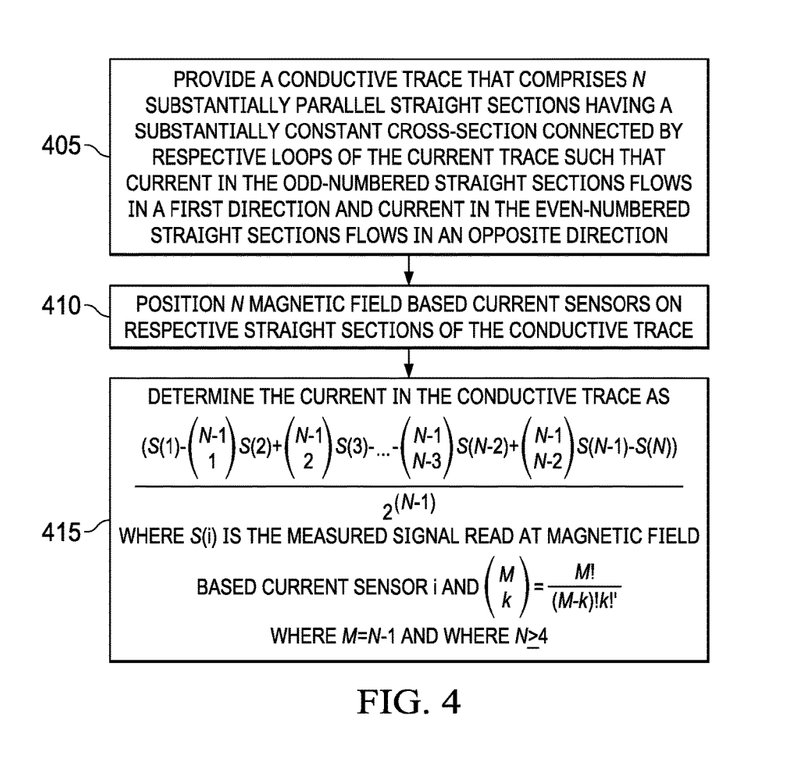
FIG. 4 illustrates a method of measuring current.

FIG. 4 illustrates a method of measuring a current according to an embodiment of the disclosure. The method begins by providing (405) a conductive trace that comprises N substantially parallel straight sections having a substantially constant cross-section, where N is an integer greater than or equal to four. Adjacent straight sections are spaced apart by a given distance and each pair of adjacent straight sections is connected by a respective loop of the current trace such that current in the odd-numbered straight sections flows in a first direction and current in the even-numbered straight sections flows in an opposite direction. N magnetic field based current sensors are positioned (410) on a respective straight section of the conductive trace. The current is then determined (415) using the equation below:

$$\frac{\left(S(1) - \binom{N-1}{1}S(2) + \binom{N-1}{2}S(3) - \ldots - \binom{N-1}{N-3}S(N-2) + \binom{N-1}{N-2}S(N-1) - S(N)\right)}{2^{(N-1)}},$$

where S(i) is the measured signal read at magnetic field based current sensor i and $$\binom{M}{k} = \frac{M!}{(M-k)!k!},$$

where M=N—1.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A system for measuring current comprising:
   a conductive trace comprising N substantially parallel straight sections having a substantially constant cross-section, wherein adjacent substantially straight sections are spaced apart by a given distance and each pair of adjacent substantially straight sections is connected by a respective loop of the current trace such that current in the odd numbered substantially straight sections flow in a first direction and current in the even numbered substantially straight sections flow in an opposite direction; and
   N magnetic field based current sensors, each current sensor being positioned on a respective substantially straight section of the conductive trace, wherein N≥4, wherein the N magnetic field based current sensors collectively sense a magnetic field value that corresponds to a magnetic field generated by the current while canceling out only the N−2 highest order terms of an interference magnetic field, and wherein the current in the conductive trace is determined based on:

$$\frac{\left(S(1) - \binom{N-1}{1}S(2) + \binom{N-1}{2}S(3) - \ldots - \binom{N-1}{N-3}S(N-2) + \binom{N-1}{N-2}S(N-1) - S(N)\right)}{2^{(N-1)}},$$

where S(i) is the measured magnetic field signal read at magnetic field based current sensor i and $$\binom{M}{k} = \frac{M!}{(M-k)!k!},$$

where M=N−1.

2. The system as recited in claim 1, wherein the magnetic field based current sensors are fluxgate sensors.

3. The system as recited in claim 1, wherein the magnetic field based current sensors are magneto-resistive (XMR) sensor elements.

4. The system as recited in claim 3, wherein the XMR sensor elements are anisotropic magneto-resistive (AMR).

5. The system as recited in claim 3, wherein the XMR sensor elements are giant magneto-resistive (GMR).

6. The system as recited in claim 3, wherein the XMR sensor elements are tunneling magneto-resistive (TMR).

7. The system as recited in claim 3, wherein the XMR sensor elements are colossal magneto-resistive (CMR).

8. The system as recited in claim 1, wherein the each respective loop of the conductive trace has a curvilinear shape.

9. A method of measuring current comprising:
   providing a conductive trace that comprises N substantially parallel straight sections having a substantially constant cross-section, wherein adjacent substantially straight sections are spaced apart by a given distance and each pair of adjacent straight sections is connected by a respective loop of the current trace such that current in the odd-numbered straight sections flows in a first direction and current in the even-numbered straight sections flows in an opposite direction;
   positioning N magnetic field based current sensors on a respective straight section of the conductive trace; and
   determining the current in the conductive trace based on $$\frac{\left(S(1) - \binom{N-1}{1}S(2) + \binom{N-1}{2}S(3) - \ldots - \binom{N-1}{N-3}S(N-2) + \binom{N-1}{N-2}S(N-1) - S(N)\right)}{2^{(N-1)}},$$

where S(i) is the measured magnetic field signal read at magnetic field based current sensor i and $$\binom{M}{k} = \frac{M!}{(M-k)!k!},$$

where M=N−1, wherein N≥4.

10. The method as recited in claim 9, wherein N=4 and the current is determined based upon the measured magnetic field as (S(1)−3*S(2)+3*S(3)−S(4))/8.

11. The method as recited in claim 9, wherein N=6 and the current is determined based upon the measured magnetic field as (S(1)−5*S(2)+10*S(3)−10*S(4)+5*S(5)−S(6))/32.

12. The method as recited in claim 9, wherein N=8 and the current is determined based upon the measured magnetic field as (S(1)−7*S(2)+21*S(3)−35*S(4)+35*S(5)−21*S(6)+7*S(7)−S(8))/128.

13. The method as recited in claim 9, wherein the each respective loop of the conductive trace comprises a curved portion having first and second ends, the first and second ends connected to respective ones of a pair of adjacent straight sections.

14. The method as recited in claim 9, wherein the N magnetic field based current sensors collectively sense a magnetic field value that corresponds to a magnetic field generated by the current while canceling out the N−2 highest order terms of an interference magnetic field.

* * * * *